United States Patent
Isobe et al.

(10) Patent No.: US 6,337,504 B1
(45) Date of Patent: *Jan. 8, 2002

(54) INSULATED GATE TRANSISTOR WITH LEAKAGE CURRENT PREVENTION FEATURE

(75) Inventors: Yoshihiko Isobe, Toyoake; Hidetoshi Muramoto, Okazaki; Hisayoshi Ooshima, Obu; Masahiro Ogino, Aichi-gun, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,733

(22) Filed: Feb. 27, 1998

(30) Foreign Application Priority Data

Mar. 10, 1997 (JP) .............................. 9-054877
Feb. 18, 1998 (JP) ........................... 10-036323

(51) Int. Cl.$^7$ .............................................. H01L 29/76
(52) U.S. Cl. ...................... 257/384; 257/386; 257/389; 257/900
(58) Field of Search ................................ 257/384, 900, 257/386, 389

(56) References Cited

U.S. PATENT DOCUMENTS

| | | | |
|---|---|---|---|
| 4,622,735 A | 11/1986 | Shibata | 438/143 |
| 4,830,971 A | 5/1989 | Shibata | 438/143 |
| 4,908,327 A | 3/1990 | Chapman | 438/231 |
| 4,949,136 A * | 8/1990 | Jain | 257/344 |
| 4,956,311 A | 9/1990 | Liou et al. | 438/231 |
| 4,983,544 A | 1/1991 | Lu et al. | 438/698 |
| 5,027,185 A | 6/1991 | Liauh | 257/413 |
| 5,089,865 A * | 2/1992 | Mitsui et al. | 257/384 |
| 5,208,472 A * | 5/1993 | Su et al. | 257/344 |
| 5,341,028 A * | 8/1994 | Yamaguchi et al. | 257/344 |
| 5,510,648 A * | 4/1996 | Davies et al. | 257/657 |
| 5,532,176 A | 7/1996 | Katada et al. | 438/232 |
| 5,652,180 A | 7/1997 | Shinriki et al. | 438/620 |
| 5,675,167 A | 10/1997 | Yamane et al. | 257/345 |
| 5,712,501 A * | 1/1998 | Davies et al. | 57/335 |
| 5,726,479 A * | 3/1998 | Matsumoto et al. | 257/412 |
| 5,949,114 A * | 9/1999 | Ma | 257/384 |
| 5,965,919 A * | 10/1999 | Yoo | 257/351 |

FOREIGN PATENT DOCUMENTS

| | | |
|---|---|---|
| JP | 04-196442 | 7/1992 |
| JP | 06-216324 | 8/1994 |
| JP | 08-274309 | 10/1996 |

* cited by examiner

*Primary Examiner*—Eddie Lee
*Assistant Examiner*—George C. Eckert, III
(74) *Attorney, Agent, or Firm*—Pillsbury Winthrop LLP (57) ABSTRACT

An MIS transistor fabricated in a manner that minimizes the occurrence of leak currents and that improves overall transistor performance by minimizing variation in location of the transistor source and drain during fabrication thereof. A gate electrode is first fabricated on a substrate. Next, a thermal oxide layer is formed on a side of the gate electrode. A masking process is then performed with the thermal oxide layer to form a source and a drain. A silicon oxide layer is then deposited over the gate electrode, the source and the drain. An etching process is performed on the silicon oxide to form a side wall oxide film over the thermal oxide layer on the side of the gate electrode and to expose surfaces of the gate electrode, the source and the drain. A metal film is then deposited over the gate electrode, the source and the drain and is heat treated to form a metal silicide film on the exposed surfaces of the gate electrode, the source and the drain. The side wall oxide film functions to disperse the metal silicide film as it is deposited to electrically separate the gate electrode, the source and the drain, thereby preventing a leakage current from occurring.

9 Claims, 5 Drawing Sheets

INSULATED GATE TRANSISTOR WITH LEAKAGE CURRENT PREVENTION FEATURE

CROSS-REFERENCE TO RELATED APPLICATION

This application is related to Japanese Patent Application Nos. Hei 9-54877 filed on Mar. 10, 1997 and Hei 10-36323 filed on Feb. 18, 1998, incorporated herein by reference.

BACKGROUND OF THE INVENTION

1. Field of the Invention

The present invention relates to an MIS transistor having a so-called salicide structure in which high melting point metallic silicide film is formed on the respective upper surfaces of a gate electrode, a source and a drain, and to a fabricating method thereof.

2. Description of Related Art

A salicide structure in which a metal silicide film is formed on the respective upper surfaces of a gate electrode, a source and a drain in an MIS transistor is well known in the art. The MIS transistor having the salicide structure is formed by selectively silicifying a metal film in a region closely in contact with silicon by attaching and treating by heat the metal film while exposing the upper face of the gate electrode and the upper faces of diffusion layers of a source and a drain and by removing, by etching, the part of the metal film not treated. Subsequently, the gate electrode is electrically separated from the source and the drain by forming side wall silicon oxide ($SiO_2$) films on the sides of the gate electrode. For the side wall oxide films, a mask (spacer) used in implanting ions to form the high concentrate source and drain having an LDD structure is utilized. However, in implanting ions, the spacer damages the bond of $SiO_2$ composing the sidewall oxide film such that the bond is destroyed. When a salicide forming step is performed by using the damaged side wall oxide film as a mask, silicon from the damaged $SiO_2$ reacts with the metal for forming the metal silicide film. As a result, the gate electrode often cannot be fully separated electrically from the source and the drain because the metal silicide film remains on the side wall oxide films.

Taking this problem into consideration, a method for fully separating the gate electrode from the source and the drain has been disclosed in Japanese Patent Application Laid-Open No. Hei. 4-196442.

The above application discloses that an oxide film is formed by means of CVD on the whole upper surface of a wafer after forming a gate electrode on a substrate while interposing a gate insulating film therebetween. Then, the oxide film is etched by means of RIE and is thermally oxidized to form a side wall oxide film composed of $SiO_2$. Then, a source and a drain are formed by implanting ions by using the sidewall oxide film as a mask. After that, a part of the side wall oxide film, i.e. the part where the bond of silicon and oxygen is destroyed by the implantation of ions (hereinafter referred to as a damaged layer) is removed by wet etching. Then, a side wall oxide film is formed again on the side face of the gate electrode by the same method. After that, a titanium film is formed on the whole surface of the wafer and a heat treatment is performed to form titanium silicide films on the respective surfaces of the gate electrode, the source and the drain. Thus, an MIS transistor having the salicide structure in which the titanium silicide films are formed on the respective surfaces of the gate electrode, the source and the drain is formed.

However, the wet etching process used to remove the damaged side wall oxide film is difficult to control, and thus the thickness of the side wall oxide film varies considerably. Because the atomic structure of the damaged layer is not uniform, the variation of the degree of etching becomes significant.

The large variation in etching of the above wet etching process is also a factor causing variation in the thickness of the sidewall oxide film. Because a relatively long over-etching time is required to remove the damaged layer, the thickness of the side wall oxide film is largely influenced by the variation of the etching rate.

Due to the variation of the side wall oxide film caused by the above factors, the distance between the titanium silicide film and the PN junction at the channel region of the source and the drain varies, and often causes a leak current.

Further, the above-mentioned method is also inefficient, in that the number of steps required to fabricate the transistor is increased due to the additional step of removing the damaged layer.

Accordingly, it is a primary object of the present invention to solve the aforementioned problems by providing a method for fabricating an MIS transistor having a salicide structure that does not cause a leak current and that does not require removal of a damaged silicon oxide layer.

It is another object of the present invention to provide an MIS transistor having a salicide structure in which the variation of the distance between the metal silicide film and the PN junction at the source and the drain is small and being formed in a manner that minimizes the probability of a leak current occurring.

SUMMARY OF THE INVENTION

In order to attain the above-mentioned objects, an inventive method for fabricating an MIS transistor comprises steps of forming a gate electrode on a silicon substrate while interposing a gate insulating film therebetween; forming a thermal oxide film on the side face of the gate electrode; implanting ions by masking with the thermal oxide film to form a source and a drain; and after forming a deposited insulating film on the surface of the thermal oxide film, forming metal silicide films on the respective surfaces of the gate electrode, the source and the drain.

Because the deposited insulating film is formed after implanting ions to form the source and drain layers, the deposited insulating film is not damaged during the implanting of ions. Therefore, no metal silicide film is formed on the deposited insulating film and no metal silicide film is left on the deposited insulating film even if metal for forming the metal silicide film is placed on the deposited insulating film. Accordingly, the gate electrode, the source and the drain may be electrically separated completely.

Further, because the thermal oxide film whose thickness varies less is used as the mask in forming the source and the drain, the variation of the respective positions of the source and the drain may be reduced and the variation of the characteristic for preventing a leak current may be reduced.

It is noted that the deposited insulating film may be formed by $SiO_2$, SiNx or the like.

Further, an impurity layer for lowering a contact resistance may be formed selectively in a predetermined region of the source and the drain. In this case, however, it is desirable to lower the resistance of the metal silicide film and to activate the impurity layer by heat treatment.

Specifically, in heat treating the metal silicide film to activate the impurity layer for lowering the contact resistance, it is preferable to avoid the heat treatment after forming the metal silicide film as much as possible to avoid the coagulation of the metal silicide film. Accordingly, it is possible to avoid a heat treatment which might induce the coagulation of the metal silicide film by performing the heat treatment for activating (diffusing) the impurity layer at the same time of forming the impurity layer to lower the resistance of the metal silicide film.

Further, it is possible to diffuse the impurity layer and simultaneously lower the resistance of the metal silicide film by forming the impurity layer after forming the metal silicide film.

Further, in addition to the source and the drain, it is possible to form a field relaxation layer by implanting ions obliquely by masking with the thermal oxide film. Because the field relaxation layer is formed by using the same mask as that used for forming the source and the drain, and the mask is the thermal oxide film whose thickness varies less, the variation of the position where the field relaxation layer is formed may be reduced.

An inventive MIS transistor comprises a gate electrode formed on a silicon substrate with a gate insulating film interposed therebetween, a thermal oxide film formed on the side face of the gate electrode, a source and a drain formed by masking with the thermal oxide film, a deposited insulating film formed on the surface of the thermal oxide film at the side wall of the gate electrode, and metal silicide films formed on the respective surfaces of the gate electrode, the source and the drain by masking with the deposited insulating film.

The positions of the source and the drain formed by masking with the thermal oxide film vary less. Further, because the metal silicide films are formed by masking with the deposited insulating film, a distance between the side edge of the channel region of the source and the drain and the metal silicide film is larger than the thickness of the deposited insulating film.

Therefore, it is possible to prevent a leak current from being generated from the metal silicide films to the channel region of the source and the drain even if the metal silicide films diffuse in the surface direction of the silicon substrate.

It is noted that it is possible to form the source and the drain by forming the gate electrode on the silicon substrate while interposing the gate insulating film therebetween and by implanting ions by masking with the gate electrode. In this case, the deposited insulating film is formed on the side wall of the gate electrode and the metal silicide films are formed on the respective surfaces of the gate electrode, the source and the drain.

Thus, the source and the drain may be formed by masking with the gate electrode.

The above and other related objects and features of the invention will be apparent from a reading of the following description of the disclosure found in the accompanying drawings and the novelty thereof pointed out in the appended claims.

DESCRIPTION OF PREFERRED EMBODIMENTS

FIGS. 1A through 1C and FIGS. 2A through 2D show a method for fabricating a MOS transistor having a salicide structure when titanium is used as a silicide material (high melting-point metal). As shown in FIGS. 1A through 1C and FIGS. 2A through 2D, formation of both a PMOS transistor and an NMOS transistor will now be explained.

Figure 1A:
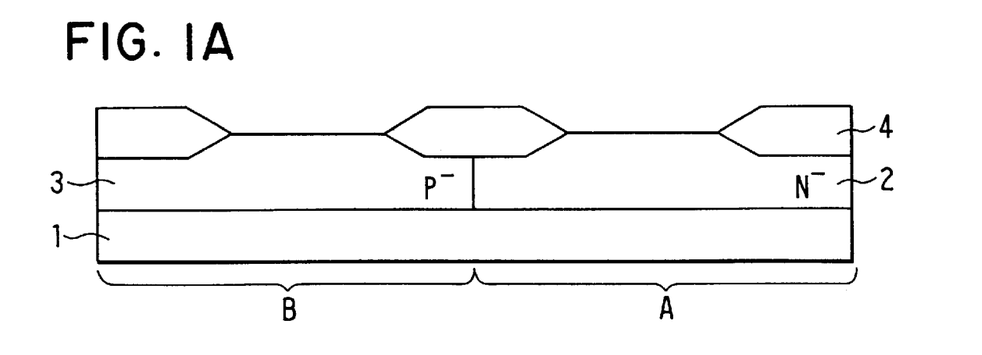
FIGS. 1A through 1C are section views showing steps for fabricating an MOS transistor according to a first embodiment.

At first, an N well layer 2 is formed in a PMOS transistor region A side within a silicon substrate 1, and a P well layer 3 is formed in an NMOS transistor region B side by LSI forming techniques. Then, a LOCOS oxide film 4 for separating devices is formed on the surface of these regions.

Next, a gate oxide film 5 is formed by performing sacrificial oxidation and gate oxidation. Then, after depositing poly-silicon, ions are implanted to the poly-silicon and are thermally diffused to lower the resistance. After that, photo-lithographic etching is performed to form a gate electrode 6 having a gate length of about 0.35 nm or less.

Figure 1B:
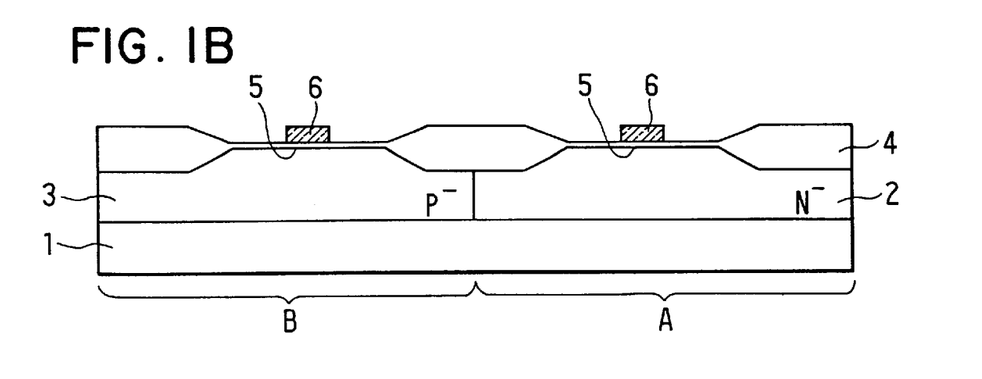

Next, a heat treatment is performed to form a thermal oxide film ($SiO_2$) 7 which turns out to be a first side wall film on the surface of the gate electrode 6. At this time, the thermal oxide film 7 is formed to be about 50 nm. Because the thermal oxide film 7 formed by the heat treatment varies less, the variation of the first side wall film may be lessened.

Figure 1C:
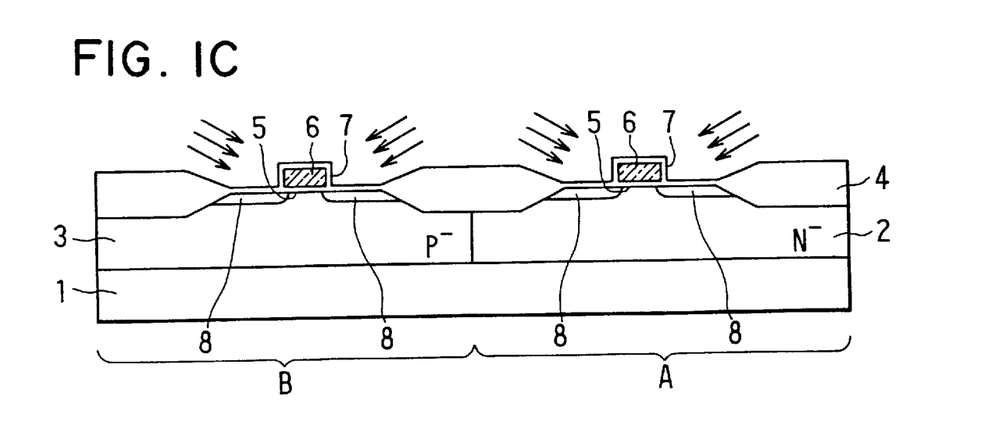

Then, the PMOS transistor region A side and the NMOS transistor region B side are covered sequentially by a photoresist. Low concentrate impurity ions are then implanted obliquely while masking with the thermal oxide film 7 to form respective field relaxation layers 8. As the oblique ion implanting condition of this time, phosphorus is implanted as the impurity in the NMOS transistor region B side with an angle of 35 degrees, an acceleration voltage of 70 keV and a dose of $1\times10^{14}/cm^2$ for example. In the PMOS transistor region A side, boron ions or compound ions containing boron are implanted obliquely. It is noted that phosphorus ions may be implanted obliquely to the PMOS transistor region A side and to the NMOS transistor region B side in common. In this case, the dose and the like thereof is selected so that the field relaxation layer 8 functions as a punch-through suppression layer in the PMOS transistor.

Figure 2A:
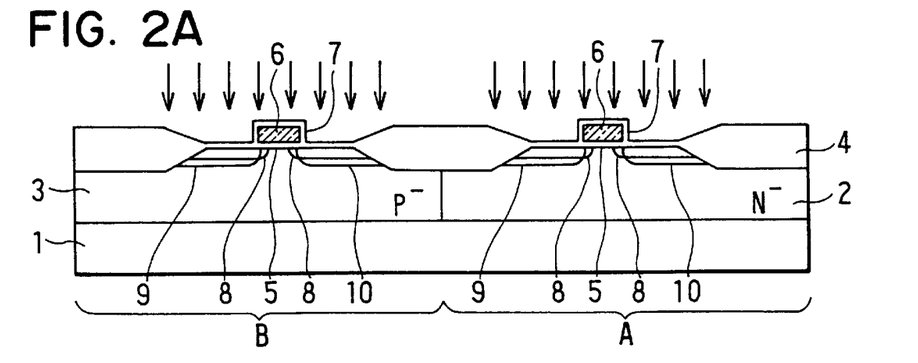
FIGS. 2A through 2D are section views showing steps for fabricating the MOS transistor, continued from the steps in FIG. 1.

Further, photoresist is coated on the PMOS transistor region A side and the NMOS transistor region B side one after another and high concentrate impurity ions are implanted vertically to the substrate by masking with the respective thermal oxide films 7 in the same manner to form a source 9 and a drain 10, respectively, as shown in FIG. 2A. It is noted that at this time, $BF_2$ ions are implanted in the PMOS transistor region A side under the condition of an acceleration voltage of 35 keV and a dose of about $1.5\times10^{15}/cm^2$. To the NMOS transistor region B side, arsenic ions are implanted under the condition of an acceleration voltage of 40 keV and a dose of about $5\times10^{15}/cm^2$. Thereby, the LDD (Lightly Doped Drain) structure is completed. Further, because the field relaxation layer 8, the source 9 and the drain 10 are formed by using the thermal oxide film 7 whose variation is small as described before, the variation of the position where the field relaxation layer 8, the source 9 and the drain 10 are formed may be lessened.

Figure 2B:
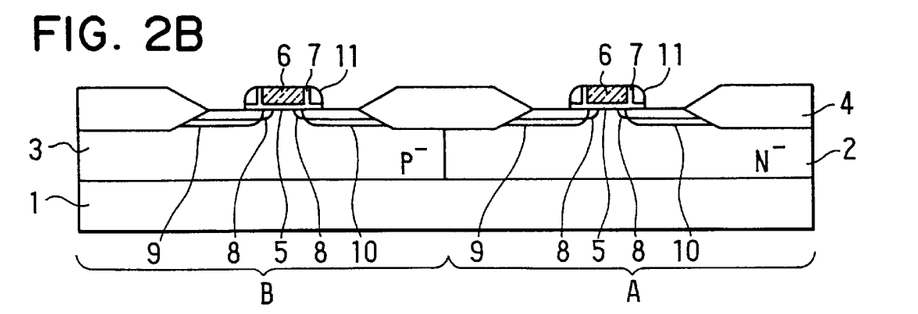
Figure 2C:
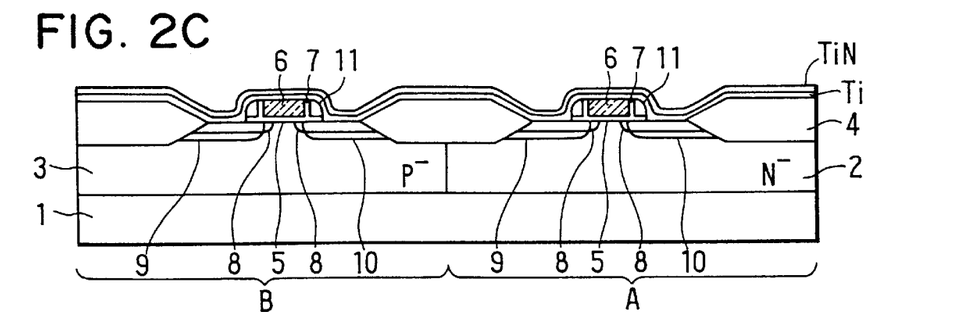

Next, after depositing $SiO_2$ of about 200 nm on the whole surface of the wafer by means of thermal CVD, anisotropic etching is performed by means of RIE to form a side wall oxide film (deposited insulating film) 11, which is the second side wall film, and to expose the gate electrode 6, the source 9 and the drain 10. At this time, the thermal oxide film 7 and the side portion of the gate electrode 6 formed previously are almost vertical to the silicon substrate 1, the side wall oxide film 11 thus formed is triangular whose gradient is steep.

Subsequently, a titanium silicifying step is performed. That is, a titanium film of about 20 nm and a titanium nitride film of about 80 nm are deposited, respectively, on the whole surface of the wafer (see FIG. 2C). A heat treatment (RTA) is then performed for a short time at a temperature of from 625 to 650° C. to cause a silicifying reaction to form titanium silicide films (TiSi film) 6a, 9a and 10a selectively on the exposed surfaces of the gate electrode 6, the source 9 and the drain 10, respectively. It is noted that the temperature of the heat treatment for the silicification is set at a relatively low temperature of 700° C. or less to prevent the silicide from crawling up to the side wall oxide film 11, to prevent the side wall oxide film 11 from reacting with Si, and to prevent $TiSi_2$ from transforming from $C_{49}$ to $C_{54}$ phase.

Figure 2D:
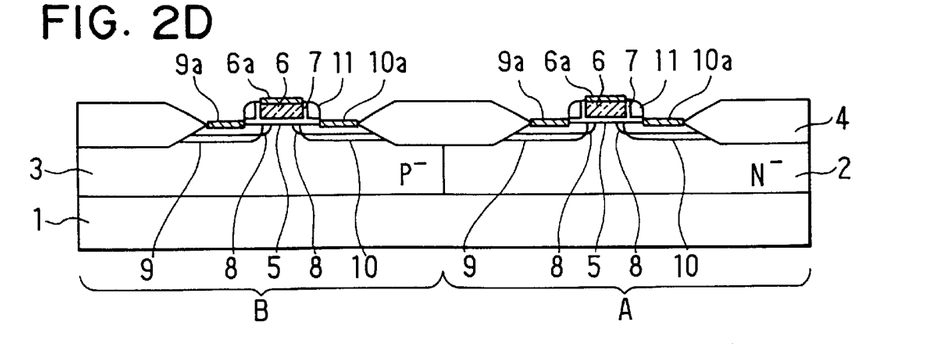

Then, etching is performed selectively by mixed a solution of ammonia and hydrogen peroxide to remove titanium, titanium nitride and other materials which did not cause the silicification reaction. Thus, only the titanium silicide films 6a, 9a and 10a remain and the salicide structure is completed. It is noted that even if a natural oxide film is formed more or less before depositing the Ti film on the exposed surface of Si, the natural oxide film is reduced during the silicification reaction and does not hamper the silicification reaction.

It is noted that because the gradient of the side wall oxide film 11 is steep, the titanium film and the like hardly deposit on the surface of the side wall oxide film 11. Therefore, a thickness of the titanium film and the like deposited on the surface of the side wall oxide film 11 is thin and may be readily removed by etching.

After completing the salicide structure shown in FIG. 2D, another heat treatment is performed for a short time at about 850° C. to lower the resistance of the titanium silicide films 6a, 9a and 10a. Further, although not shown, an interlayer insulating film, a barrier metal and an aluminum wire are patterned and are formed, thus completing a semiconductor device in which the PMOS and NMOS transistors having the salicide structure are formed.

Because the side wall oxide film 11 is formed after implanting ions to form the layers of the field relaxation layer 8, the source 9 and the drain 10 as described above, the side wall oxide film 11 is not damaged during the implantation of ions and the bond of $SiO_2$ composing the side wall oxide film 11 is not destroyed. Therefore, even if the titanium film and the like is formed on the side wall oxide film 11, no titanium silicide film is formed on the side wall oxide film 11. As a result, no titanium silicide film remains on the sidewall oxide film 11. Accordingly, the gate electrode 6 may be electrically separated completely from the source 9 and the drain 10.

Further, because the variation of the position where the field relaxation layer 8, the source 9 and the drain 10 are formed may be lessened as described above, the variation of the characteristic of preventing the leak current may be lessened.

Figure 3A:
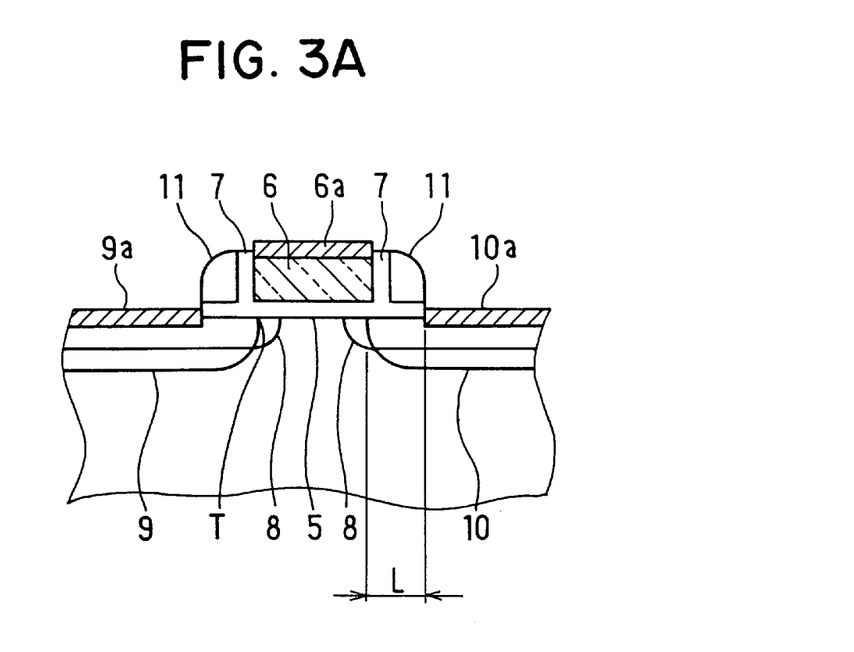
FIGS. 3A and 3B are section views showing MOS transistors having salicide structures.
Figure 3B:
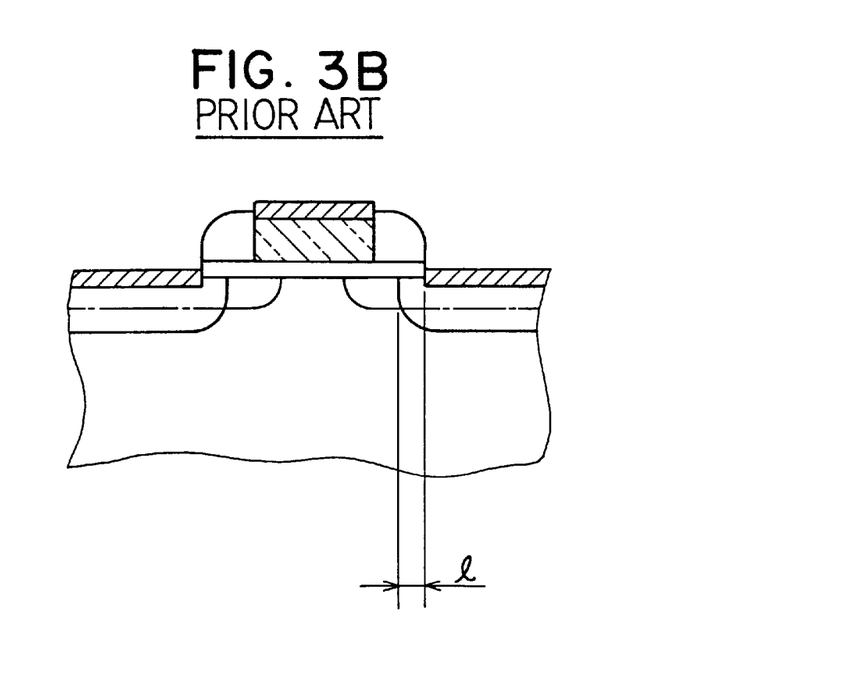

FIGS. 3A and 3B are section views of the MOS transistor having the salicide structure. Because the source 9 and the drain 10 are formed by using the thermal oxide film 7 whose variation of thickness is negligible as a mask in the present embodiment as shown in FIG. 3A, the variation of the position to the gate is also negligible. In addition, because the side wall oxide film 11 is disposed after forming the source and the drain, the source and the drain are located entirely underneath the lower layer portion of the side wall oxide film 11. Accordingly, the titanium silicide films 9a and 10a on the surface of the source 9 and the drain 10 and the side edge T of a channel region of the source 9 and the drain 10 are formed so as to have a distance L which is greater than the thickness of the side wall oxide film 11.

When the side wall oxide film is used as a mask in forming the source and the drain and as a mask in a silicide forming step, as in the prior art example shown in FIG. 3B, a distance 1 between the side edge of the channel of the source and the drain and the edge of the silicide film is shorter than a width of the side wall oxide film.

When the silicide film is formed, there is a possibility that it diffuses horizontally between the interface of the gate oxide film 5 and each well layer (substrate) 2 and 3 and that the titanium silicide films 9a and the drain 10a reach the channel region due to the diffusion in the horizontal direction, thus leaking a current. The shallower the diffusion depth of the source and the drain, the more dramatic the diffusion, due to the micronization of devices.

However, because the titanium silicide films on the surface of the source 9 and the drain 10 and the side edges T of the channel region of the source 9 and the drain 10 are formed so as to have the distance which is greater than the thickness of the side wall oxide film 11 as shown in FIG. 3A, it is possible to arrange so that the titanium silicide films 9a and 10a will not reach the channel region even if they diffuse horizontally by controlling the thickness of the side wall film. Thus, the present embodiment allows the position of edge T of the channel region of the source 9 and the drain 10 and the edge of the silicide film to be independently controlled as described above, so that it is effective in suppressing the leak current which might be caused by the horizontal diffusion of the titanium silicide films 9a and 10a.

Figure 4A:
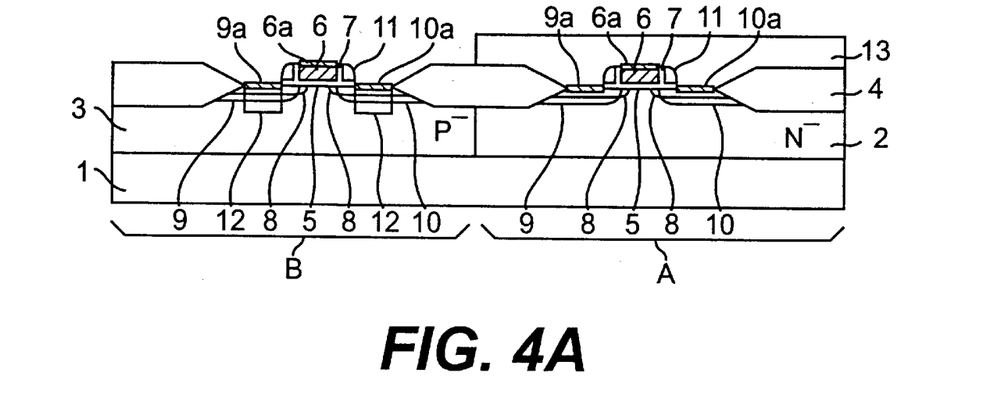
FIGS. 4A through 4C are section views showing steps for fabricating a MOS transistor according to a second embodiment.
Figure 4B:
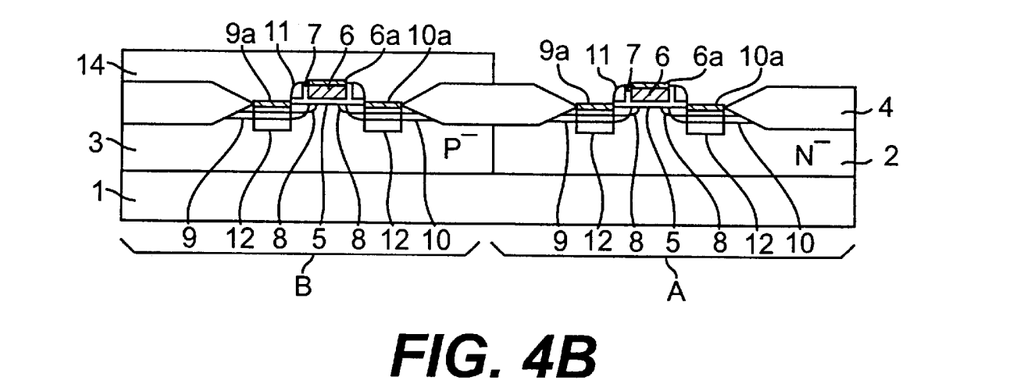
Figure 4C:
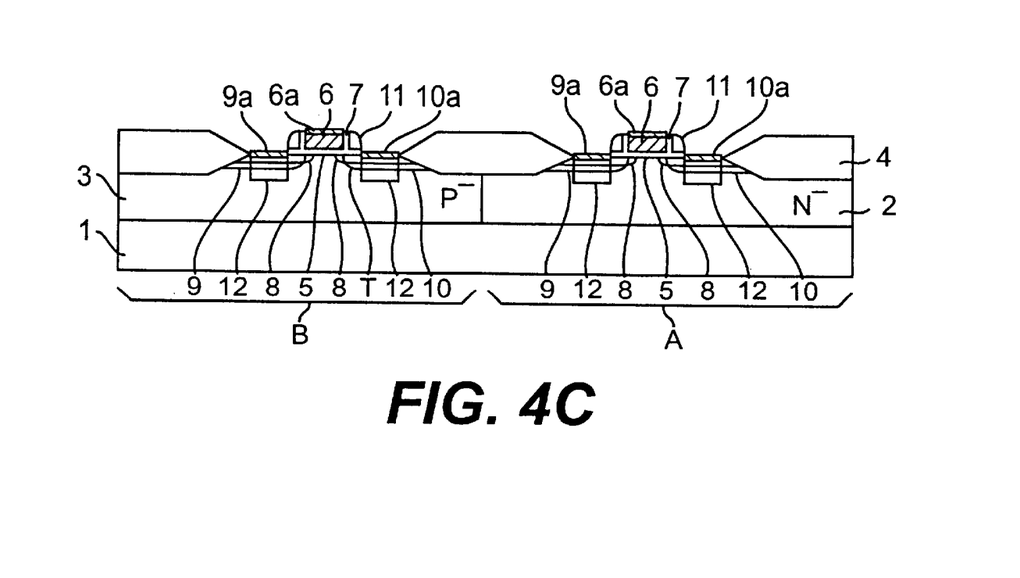

Steps for fabricating a MOS transistor of the present invention according to a second embodiment will be explained with reference to FIGS. 4A through 4C. At first, the salicide structure is completed by forming the titanium silicide films 6a, 9a and 10a on the surface of the gate electrode 6, the source 9 and the drain 10 through the steps shown in FIGS. 1A through 1C and in FIGS. 2A through 2D. Then, steps shown in FIGS. 4A through 4C are performed. The steps for fabricating the MOS transistor shown in FIGS. 4A through 4C will be explained below with reference to the drawings.

At first, contact resistance lowering layers 12 are formed within the source 9 and the drain 10 by covering the PMOS transistor region A side by photoresist 13 and selectively implanting N type impurity ions such as phosphor to the NMOS transistor region B side. At this time, when phosphor is used as the impurity, the ions are implanted under the condition of an acceleration voltage of 30 keV and a dose of about $1 \times 10^{15}/cm^2$.

Next, after removing the photoresist 13 of the PMOS transistor region A side, the contact resistance lowering layer 12 is formed by covering the NMOS transistor region B side by photoresist 14 and by selectively implanting P type impurity ions such as boron to the PMOS transistor region A side in the same manner as described before. At this time, when boron is used as the impurity, the ions are implanted under the condition of an acceleration voltage of 20 keV and a dose of about $1\times10^{15}/cm^2$. Through these processes, the contact resistance lowering layers 12 are formed in the PMOS transistor region A side and the NMOS transistor region B side, respectively.

After removing the photoresist 14 on the NMOS transistor region B side, the second heat treatment for lowering the resistance of the silicide film shown in the first embodiment is performed at 850° C. to lower the resistance of the titanium silicide films 6a, 9a and 10a and to activate the impurity ions implanted to complete the salicide structure.

In the past, the titanium silicide films have had a tendency to coagulate when the high temperature heat treatment necessary for activating the implanted ions is performed after the step of forming the salicide. However, it is possible to prevent the titanium silicide films from coagulating because the contact resistance lowering layer 12 is formed before the second heat treatment and the impurity is activated in the same time with the second heat treatment.

It is noted that the contact resistance lowering layer 12 is not diffused horizontally to the side of the channel region of the source 9 and the drain 10 even when the diffusion in the direction of the face of the silicon substrate 1 (horizontal direction) occurs in activating the impurity ions because the contact resistance lowering layer 12 is formed by selectively implanting ions so that it aligns with the side wall oxide film 11. Accordingly, as shown in FIGS. 4A through 4C, the impurity layers of three kinds of concentrations, the field relaxation layer 8, the source 9, the drain 10, and the contact resistance lowering layer 12 are formed such that they are offset sequentially in the horizontal direction of the silicon substrate 1. With the micronization of the device size, the field relaxation layer 8, the source 9 and the drain 10 which must be formed so that they align accurately with the gate electrode are required to thin the diffusion depth thereof. In this case, an internal resistance in each region increases, so that it is required to implant ions additionally in order to lower the series resistance between the source and the drain. The present embodiment allows the contact resistance lowering layer 12 to be disposed in the manner of self-alignment and in offset from the edge T of the channel region of the source and the drain, so that it can respond fully to the above-mentioned requirement.

Referring to FIGS. 5A through 5D, a third embodiment of the present invention will now be described.

While the contact resistance lowering layers 12 have been formed after forming the titanium silicide films 6a, 9a and 10a in the second embodiment, the contact resistance lowering layers 12 are formed before forming the titanium silicide films 6a, 9a and 10a in the present embodiment.

At first, steps shown in FIGS. 5A through 5D are performed after forming the side wall oxide film 11 as shown in FIG. 2B undergoing through the steps shown in FIGS. 1A through 1C and FIGS. 2A and 2B. The steps for fabricating the MOS transistor will be explained with below reference to FIGS. 5A through 5D.

Figure 5A:
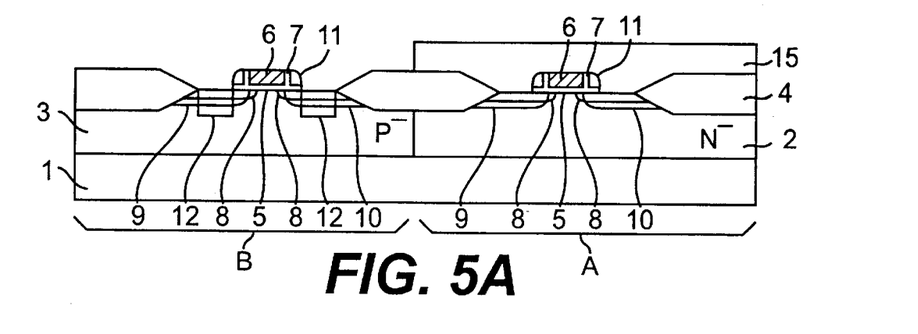
FIGS. 5A through 5D are section views showing steps for fabricating an MOS transistor according to a third embodiment.

At first, the contact resistance lowering layer 12 is formed by covering the PMOS transistor region A side by photoresist 15 and by selectively implanting N type impurity ions such as phosphorus to the NMOS transistor region B side. The condition for implanting ions at this time is the same with that described in the second embodiment.

Figure 5B:
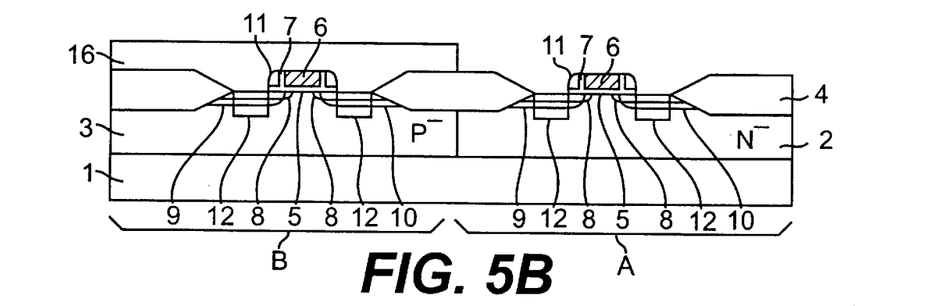
Figure 5C:
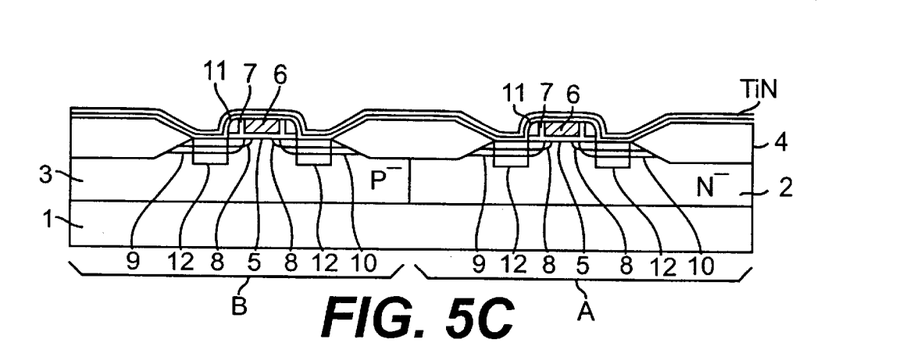

Next, after removing the photoresist 15 on the PMOS transistor region A side, the contact resistance lowering layer 12 is formed by covering the NMOS transistor region B side by photoresist 16 and by selectively implanting P type impurity ions such as boron to the PMOS transistor region A side in the same manner as described above. The condition for implanting ions at this time is the same with that described in the second embodiment.

Figure 5D:
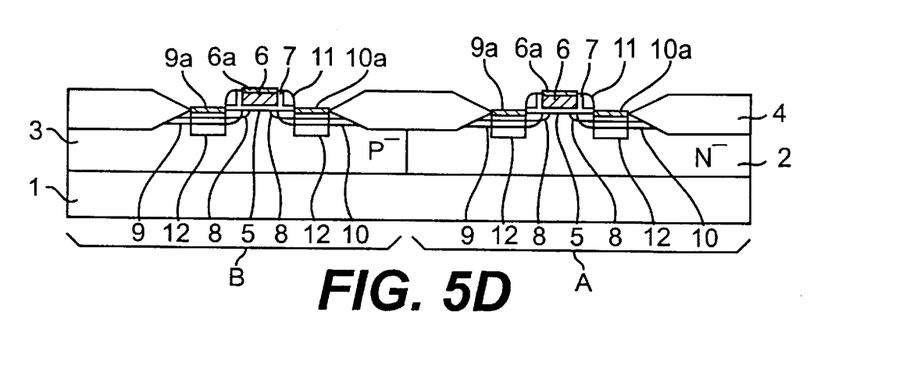

After that, the photoresist 16 on the NMOS transistor region B side is removed. Then, the salicide structure shown in FIG. 5D is completed by depositing a TiN/Ti film (FIG. 5C), by selectively silicifying the Ti film in the region in contact with Si and by removing the TiN/Ti film not reacted in the same manner with the forming step shown in FIGS. 2C and 2D described before. Then, the implanted impurity ions are activated by the heat treatment during the salicide forming step and the heat treatment for lowering the resistance thereafter.

Thereby, the same effect with the second embodiment may be obtained.

It is noted that the third embodiment may be modified as follows. That is, the main point of the third embodiment lies in that the contact resistance lowering layer 12 is disposed before the salicide forming step. Accordingly, beside the method of commonly using the activating annealing thereof with the heat treatment of the salicide forming step, the activating annealing may be performed right after removing the photoresist 16 before the salicide forming step, i.e. after the step shown in FIG. 5B. The same effect with the third embodiment may be obtained also in this case. It is noted that the ions are implanted to form the contact resistance lowering layer 12 after forming the side wall oxide film in the third embodiment. Accordingly, the side wall may be formed additionally by means of CVD in order to prevent residue of silicide from depositing on the side wall.

Although the field relaxation layer 8, the source 9, the drain 10 or the contact resistance lowering layer 12, i.e. the impurity layers, have been formed by covering the PMOS transistor region A side and the NMOS transistor region B side by the predetermined photoresists respectively in the first through third embodiments, they may be formed by forming the above-mentioned photoresist only on either of the regions.

For instance, in case of forming the P type impurity layers of the field relaxation layer 8, the source 9 and the drain 10 on the PMOS transistor region A side, the N type impurity is implanted also to the PMOS transistor region A side without covering the PMOS transistor region A side by the photoresist in implanting the N type impurity ions to the NMOS transistor region B side. Then, after that, the NMOS transistor region B side is covered by the photoresist and the P type impurity ions are implanted to the PMOS transistor region A side.

Although the N type impurity is canceled by the P type impurity previously implanted at this time, it is possible to bring about a state in which substantially the P type impurity layer is formed by controlling the carrier concentration by increasing the dose of the P type impurity. Thereby, a number of steps may be reduced.

Further, although the field relaxation layer 8, the source 9 and the drain 10 have been formed after forming the thermal oxide film 7 in the first through third embodiments, it is possible to form the source 9 and the drain 10 by implanting ions by masking only by the gate electrode 6 without forming the thermal oxide film 7. In this case, it is also possible to form a semiconductor device having the salicide structure by disposing the side wall oxide film 11 and by performing the above-mentioned salicide forming step after forming the source 9 and the drain 10. However, it is desirable to mask with the thermal oxide film 7 as shown in the first through third embodiments because there is a possibility in this case that the ions are implanted directly to the gate electrode 6 without going through the thermal oxide film 7 and the gate electrode 6 might be damaged.

Although the TiN/Ti double layer film has been used as the silicide material in the first through third embodiments, it is possible to use a titanium single layer film. Further, it is possible to use cobalt or nickel instead of Ti metals.

Also, although $SiO_2$ has been deposited by means of CVD and the side wall oxide film 11 has been formed thereby, it is possible to deposit SiNx by means of CVD and to form the side wall oxide film 11 by anisotropically etching SiNx and the like thus deposited in the same manner.

While preferred embodiments of the present invention have been described, variations thereto will occur to those skilled in the art within the scope of the present inventive concepts which are delineated by the following claims.

What is claimed is:

1. An insulated gate transistor, comprising:

a gate oxide film formed on a silicon substrate to create an oxidation/silicon interface with a silicon face of the silicon substrate;

a gate electrode formed over the silicon substrate with the gate oxide film interposed therebetween, the gate oxide film extending continuously along a gate-length direction under respective side-walls of the gate electrode to form extending portions, the extending portions extending in an outward direction from side walls of said gate electrode;

thermal oxide films disposed on the side walls of the gate electrode, each thermal oxide film linking with a respective extending portion of the gate oxide film;

a source and a drain disposed in a surface of the silicon substrate, lateral diffusion edges of the source and the drain being positioned horizontally inside respective outward surface positions of the thermal oxide films on the respective side walls of the gate electrode;

insulation layers disposed on the side walls of the gate electrode which cover the thermal oxide films and the extending portions of the gate oxide film; and conductive silicide films disposed on respective surfaces of the gate electrode, the source and the drain, wherein:

the deposited insulation layers cause electrical separation of the conductive silicide film on the gate electrode from the respective conductive silicide films on the source and the drain; and the extending portions of the gate oxide film defining lateral edges of the conductive silicide films disposed on the respective surfaces of the source and the drain at positions spaced apart from the lateral diffusion edges of the source and the drain respectively, whereby an influence due to an invasion of the conductive silicide films along the oxidation/silicon interface is restrained.

2. The transistor of claim 1, wherein distances from the lateral diffusion edges of the source and drain to the corresponding lateral edges of the conductive silicide films are larger than widths, along the channel-length direction, of the corresponding deposited insulation layers, respectively.

3. The transistor of claim 1, wherein the deposited insulation layers comprise silicon oxide.

4. The transistor of claim 1, wherein the conductive silicide films comprises titanium silicide.

5. The transistor of claim 1, wherein the deposited insulation layers comprise silicon nitride.

6. The transistor of claim 1, further comprising a lightly doped region which has a same conductivity type as the drain and the source, the lightly doped region being disposed on a channel side of the drain or the source.

7. The transistor of claim 1, further comprising a punch-through stop region which has a conductivity type different from the drain and the source, the punch-through stop region being disposed on a channel side of the drain or the source.

8. The transistor of claim 1, further comprising deep regions which overlap with the source and the drain respectively, the deep regions having a same conductivity type as the drain and the source and having diffusion depth deeper than the source and the drain, lateral diffusion edges of the respective deep regions being based upon outward positions of the deposited insulation layers on the respective side-walls of the gate electrode.

9. The transistor of claim 6, wherein the drain and the source are provided at least partially beneath the gate electrode.

* * * * *